United States Patent
Iwaki et al.

[11] Patent Number: 6,134,154
[45] Date of Patent: Oct. 17, 2000

[54] SEMICONDUCTOR MEMORY DEVICE WITH SEVERAL ACCESS ENABLED USING SINGLE PORT MEMORY CELL

[75] Inventors: Hiroaki Iwaki; Kouichi Kumagai, both of Tokyo, Japan

[73] Assignee: NEC Corporation, Tokyo, Japan

[21] Appl. No.: 09/281,215

[22] Filed: Mar. 30, 1999

[30] Foreign Application Priority Data

Apr. 3, 1998 [JP] Japan .................................. 10-091373

[51] Int. Cl.$^7$ ...................................................... G11C 7/00
[52] U.S. Cl. ............................... 365/189.04; 365/189.01; 365/230.06; 365/230.08; 365/230.01; 365/233
[58] Field of Search ......................... 365/189.01, 189.04, 365/230.01, 230.03, 230.06, 230.08, 233

[56] References Cited

U.S. PATENT DOCUMENTS

| | | | |
|---|---|---|---|
| 5,587,950 | 12/1996 | Sawada et al. | 365/201 |
| 5,781,480 | 7/1998 | Nogle et al. | 365/189.04 |
| 5,841,730 | 11/1998 | Kai et al. | 365/233 |
| 5,892,730 | 4/1999 | Sato et al. | 365/233 |
| 5,973,955 | 10/1999 | Nogle et al. | 365/154 |

FOREIGN PATENT DOCUMENTS

| | | |
|---|---|---|
| 6-161870 | 6/1994 | Japan . |
| 7-84987 | 3/1995 | Japan . |
| 8-328941 | 12/1996 | Japan . |

*Primary Examiner*—Viet Q. Nguyen
*Attorney, Agent, or Firm*—Young & Thompson

[57] ABSTRACT

In a semiconductor memory device, a plurality of memory cells are arranged in a matrix. Each of the plurality of memory cells is connected to one of a plurality of word lines and is connected to one of a plurality of bit lines such that a plurality of columns are formed from the plurality of memory cells. A word line selecting section selects one of the plurality of word lines based on a first address. A first column selector selects one of the plurality of columns as a first column based on the first address. A second column selector selects another one of the plurality of columns as a second column based on a second address. An address data of a predetermined portion of the first address is not equal to an address data of the second address. An input/output section includes a first sense amplifier and a first buffer. A first read operation is performed to a first memory cell connected to the selected word line and the first column through the first sense amplifier and the first column selector and a first write operation is performed to a second memory cell connected to the selected word line and the second column through the first buffer and the second column selector.

15 Claims, 12 Drawing Sheets

SEMICONDUCTOR MEMORY DEVICE WITH SEVERAL ACCESS ENABLED USING SINGLE PORT MEMORY CELL

BACKGROUND OF THE INVENTION

1. Field of the Invention

The present invention relates to a semiconductor memory device, and more particularly to a semiconductor memory device which can perform a read operation and a write operation at a same time using a single port memory cell.

2. Description of the Related Art

With increase of functions of a semiconductor integrated circuit, the memory capacity of a memory circuit tends to increase. As such a memory circuit, a random access memory is known, in which a write operation is performed by use of a 1-system input and a read operation is performed by use of a 2-system output. In the random access memory, 2 systems are asynchronously operated regardless of competition in case of the read operation, and arbitration is performed based on an address data in case of the write operation. The memory circuit needs a special RAM section for the structure. Therefore, the memory needs transistors several times more than a single port-type RAM section having 1-system input/output.

A dual port RAM circuit is described in Japanese Laid Open Patent Application (JP-A-Heisei 6-161870) in which the increase of elements to be used can be avoided. Because this dual port RAM circuit uses a usual single port type RAM section, it is possible to be realized by generally used semi-customed ICs so that the cost can be reduced.

The technique in which a dual port RAM is apparently configured by using a single port RAM is known in Japanese Laid Open Patent Application (JP-A-Heisei 7-84987). This technique is characterized in that a delay circuit is used for arbitration when a write operation and a read operation compete with each other. The arbitration technique in which when a plurality of requests compete in this way, one request is performed while the other requests are waited is known in Japanese Laid Open Patent Application (JP-A-Heisei 8-328941).

The increase of the memory capacity of the memory circuit causes another problem in that the area of the memory circuit increases.

Next, referring to FIGS. 1 and 2, the problem on the area increase in an SRAM circuit as the memory circuit will be described.

Generally, when a read operation and a write operation are performed in a same cycle, a 2-port SRAM circuit is used. FIG. 1 shows a block diagram illustrating a circuit structure of the synchronous type 2-port SRAM circuit having a 8-column structure of n words×m bits. In the SRAM circuit shown in FIG. 1 is composed of two sets of word lines WLa $[0:2^{n-2}-1]$ and WLb $[0:2^{n-2}-1]$, and bit line pairs Da and DBa [0:7], and Db and DBb [0:7]. Therefore, the SRAM circuit is further composed of two sets of word line decoders 403a and 403b to select one of the two sets of word lines, and two sets of column selectors 406a and 406b.

One word line WLa $[0:2^{n-2}-1]$ is selected by the word line decoder 403a based on (n−2) continuous ones of (n+1) address signals [0:n] of an address A inputted to an address latch A 402a and is driven by a word line driver A 404a. One word line WLb $[0:2^{n-2}-1$ is selected by a word line decoder 403b based on (n−2) continuous ones of (n+1) address signals [0:n] of an address B inputted to an address latch B 402b and is driven by a word line driver B 404b. The bit line pair Da [0:7] and DBa [0:7] is selected by a column decoder A 405 and a column selector A 406a based on three continuous ones of the (n+1) address signals [0:n] of the address A inputted to the address latch A 402a and is connected to a sense amplifier A 407a and a write buffer A 408a. The bit line pair Db [0:7] and DBb [0:7] is selected by a column decoder B 405b and a column selector B 406b based on three continuous ones of the (N+1) address signals [0:2] of the address B inputted to an address latch B 402b and is connected to s sense amplifier B 407b and a write buffer B 408b. In this way, the 2-port SRAM circuit needs two sets of word lines and two sets of word line decoder and word line driver must be provided to select and to drive the respective word lines.

FIG. 2 is a diagram illustrating a memory cell 401 connected to two sets of word line and bit line pair in the SRAM circuit shown in FIG. 1. The 2-port SRAM memory cell 401 is composed of two inverter gates 411 and 412 and four transfer gates 413, 414, 415 and 416 in a latch section.

FIGS. 3A to 3S are timing charts of various signals in time periods T1 to T4.

In this way, the memory cell 401 shown in FIG. 2 needs further two transistors, compared with a usual single port memory cell 101. Thus, the chip area of the 2-port SRAM circuit increases compared with the single port SRAM circuit.

As described above, it is demanded that an operation mode of the 2-port SRAM circuit can be realized by use of an SRAM circuit using single port memory cells so that both of increase of the number of elements and increase of the chip area can be avoided.

SUMMARY OF THE INVENTION

As an object of the present invention is to provide a semiconductor memory device in which an operation mode of a 2-port SRAM (Static Random Access Memory) circuit is realized by use of an SRAM circuit using single port memory cells.

Another object of the present invention is to provide a semiconductor memory device in which a read operation and a write operation is both made possible in one cycle using a single port memory cell, as realized by a conventional 2-port memory cell.

In order to achieve an aspect of the present invention, a semiconductor memory device includes a plurality of word lines, a plurality of bit lines, a plurality of memory cells, a word line selecting section, first and second column selectors, and an input/output section. The plurality of memory cells are arranged in a matrix. Each of the plurality of memory cells is connected to one of the plurality of word lines and is connected to one of the plurality of bit lines such that a plurality of columns are formed from the plurality of memory cells. The word line selecting section selects one of the plurality of word lines based on a first address. The first column selector is connected to the plurality of columns, and selects one of the plurality of columns as a first column based on the first address. The second column selector is connected to the plurality of columns, and selects another one of the plurality of columns as a second column based on a second address. An address data of a predetermined portion of the first address is not equal to an address data of the second address. The input/output section includes a first sense amplifier connected to the first column selector and a first buffer connected to the second column selector. A first read operation is performed to a first memory cell connected to the selected word line and the first column through the first sense amplifier and the first column selector and a first write operation is performed to a second memory cell connected to the selected word line and the second column through the first buffer and the second column selector.

The second column selector is disabled when the address data of the predetermined portion of the first address is equal to the address data of the second address. Also, the first read operation and the first write operation are performed in an operation cycle.

The semiconductor memory device may further include a mode switching circuit for selecting, as an operation mode in an operation cycle, one of a read mode in which the first read operation is performed, a write mode in which the first write operation is performed, and a read and write mode in which the first read operation and the first write operation are performed at a time. In this case, the first sense amplifier is set to an enable state in the read and write mode and in the read mode, and the first buffer is set to an enable state in the read and write mode and the write mode. Also, the mode switching circuit includes an inverting circuit for inverting a write control signal, a first OR gate for receiving a mode signal at one of input terminals and the write control signal at the other input terminal, and a second OR gate receiving for receiving the mode signal at one of input terminals and the inverted write control signal at the other input terminal.

Also, the input/output section may further include a second sense amplifier connected to the second column selector in parallel to the first buffer section, and a second buffer connected to the first column selector in parallel to the first sense amplifier. A second read operation is performed to the second memory cell connected to the selected word line and the second column through the second sense amplifier and the second column selector and a second write operation is the performed to the first memory cell connected to the selected word line and the first column through the second buffer and the first column selector. In this case, the semiconductor memory device may further include a mode switching circuit for selecting, as an operation mode in an operation cycle, one of a read mode in which one or both of the first read operation and the second read operation are performed, a write mode in which one or both of the first write operation and the second write operation are performed, and a read and write mode in which one of a set of the first read operation and the first write operation and a set of the second read operation and the second write operation are performed at a time.

In order to achieve another aspect of the present invention, a method of making several accesses possible in a semiconductor memory device, includes:

selecting one of rows of single port memory cells in a matrix based on a first address;

selecting one of the memory cells of the selected row as a first memory based on the first address;

selecting another one of the memory cells of the selected row as a second memory based on a second address, an address data of a predetermined portion of the first address being not equal to an address data of the second address; and accessing the first and second memory cells in an operation cycle.

A access mode may be fixed. In this case, the access to the first memory is a read access and the access to the second memory is a write access.

The selection of the second memory may be disabled when the address data of the predetermined portion of the first address is equal to the address data of the second address.

An operation mode of the semiconductor memory device may be set. In this case, when the access mode is a read mode, the accesses to one or both of the first and second memory cells are read accesses. Also, when the access mode is a write mode, the accesses to one or both of the first and second memory cells are write accesses. In addition, when the access mode is a read and write mode, the access to one of the first and second memory cells are a read access and the access to the other is a write access.

DESCRIPTION OF THE PREFERRED EMBODIMENTS

A semiconductor memory device of the present invention will be described below in detail with reference to the attached drawings.

Figure 1:
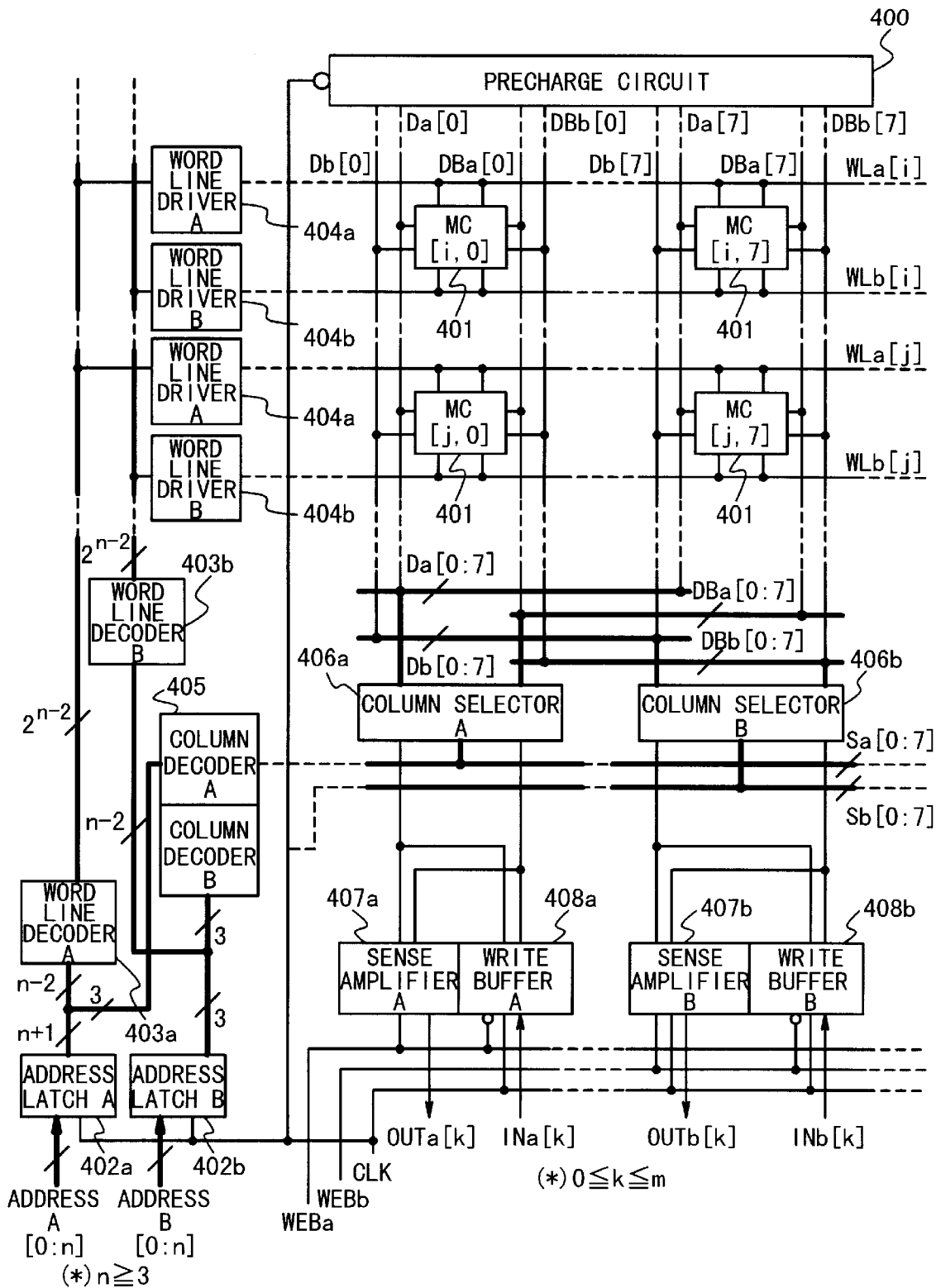
FIG. 1 is a block diagram illustrating a circuit structure of a conventional semiconductor memory device.
Figure 2:
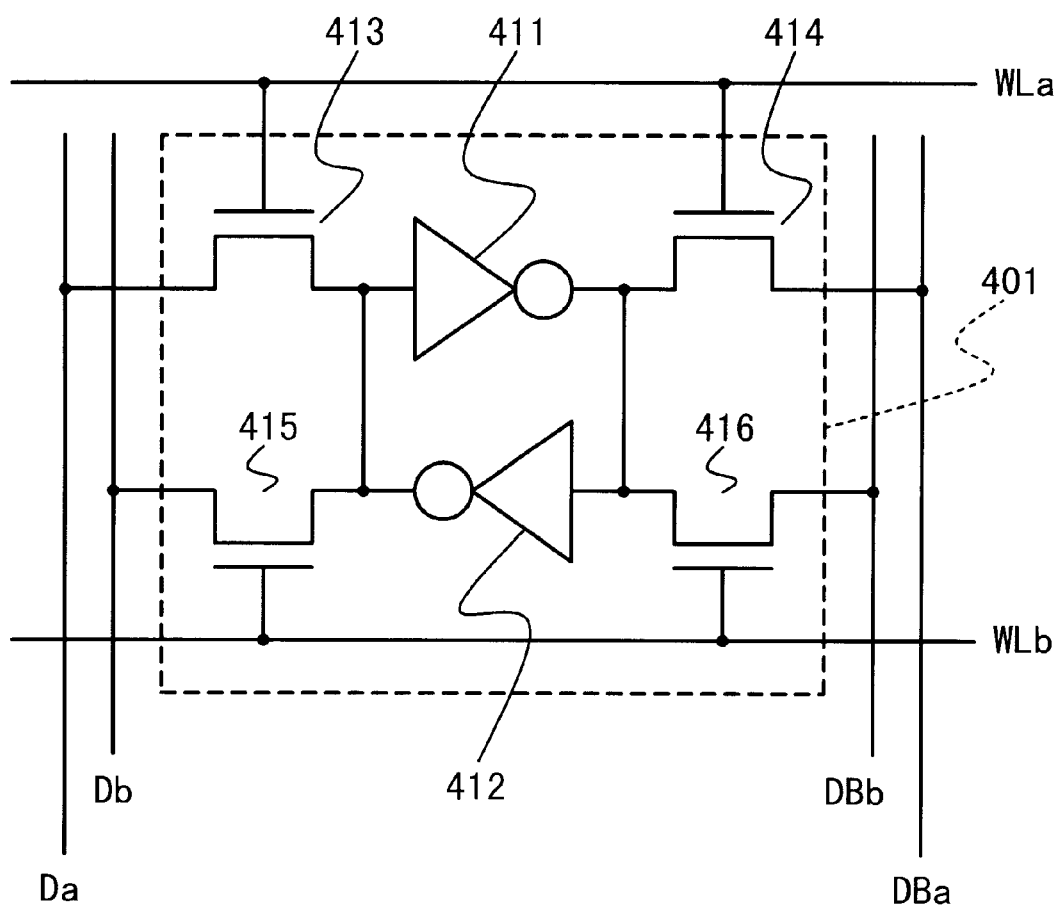
FIG. 2 is a circuit diagram illustrating a memory cell used in the conventional semiconductor memory device.
Figure 3:
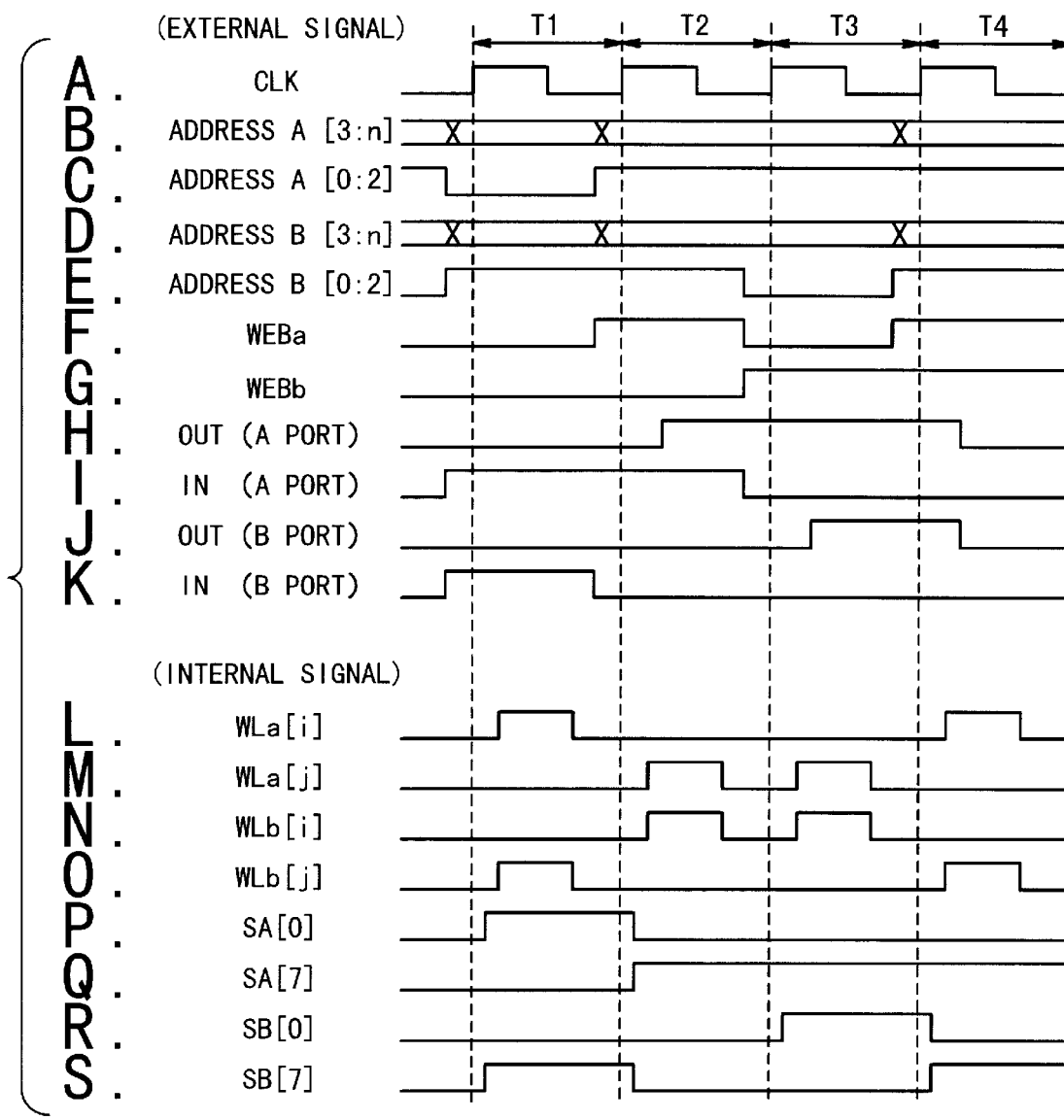
FIGS. 3A to 3S are timing charts illustrating an operation of the conventional semiconductor memory device.
Figure 4:
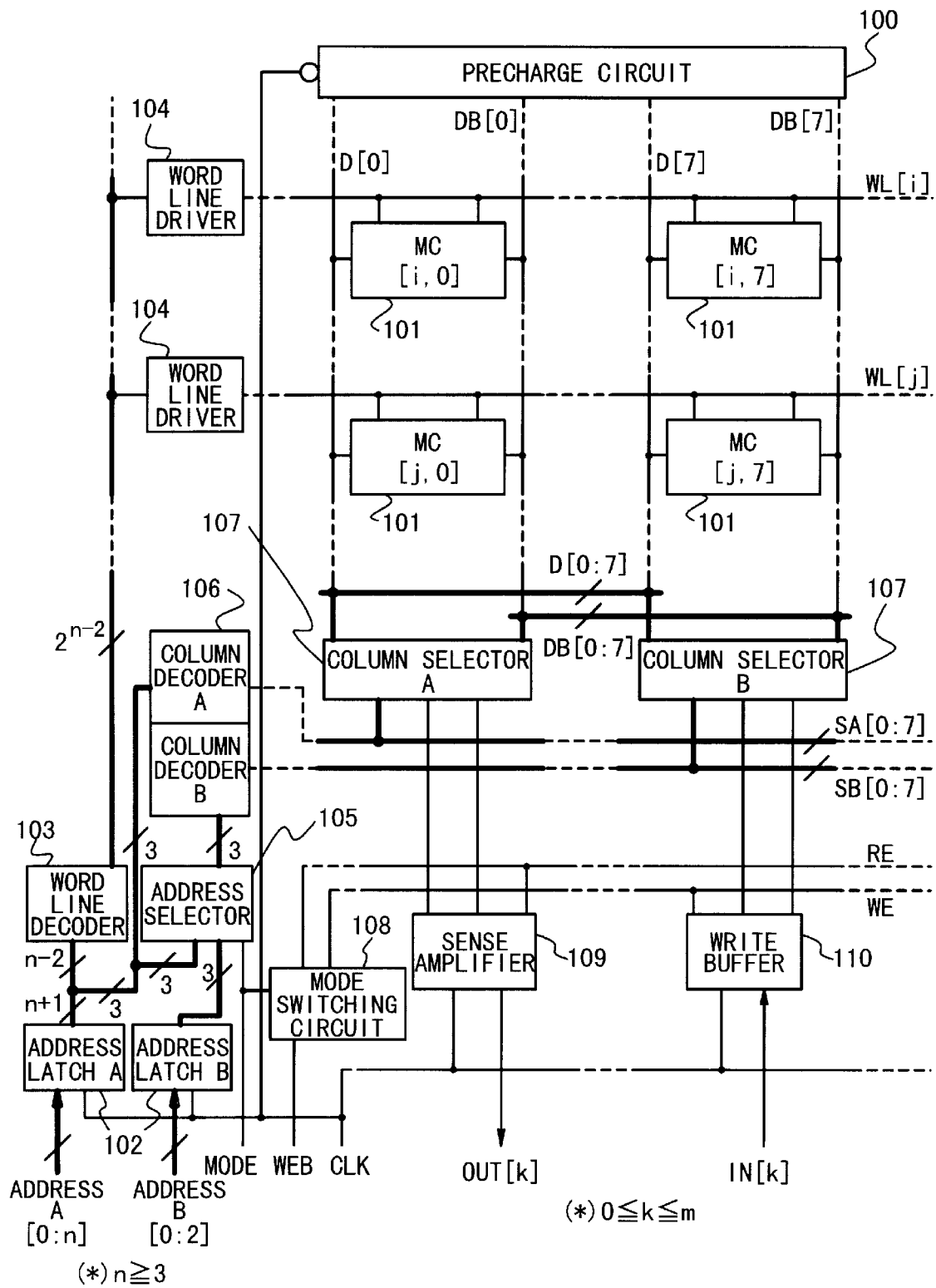
FIG. 4 is a block diagram illustrating the circuit structure of a semiconductor memory device according to a first embodiment of the present invention.

The semiconductor memory device according to the first embodiment of the present invention will be described, using an SRAM as an example. In FIG. 4, a semiconductor memory device in the first embodiment is a synchronous type SRAM circuit having of a 8-column structure of n words and m bits. The present invention can be also applied to a DRAM (dynamic random access memory).

As shown in FIG. 4, the SRAM circuit is composed of a column decoder A 106 and a column selector A 107, a column decoder B 106 and a column selector B 107. The respective sets of column decoder and column selector are controlled independently from each other based on two kinds of address A and address B.

Also, in the SRAM circuit shown in FIG. 4, one of a read and write mode, a read mode and a write mode can be selected. In the read and write mode, a read operation using the address A and a write operation using the address B are possible to be performed at a same time. Also, in the read or write mode, the same operation as a usual single port SRAM is performed using the address A. An operation mode is selected using a signal MODE, and is determined by selecting an address for column selection from the address A or the address B by an address selector 105. Also, the mode switching circuit 108 determines whether a sense amplifier 109 and a write buffer 110 should be set to an operating state in a clock cycle, based on the mode designation signal MODE and a write control signal WEB (active in a "Lo" level).

In such a structure, a word line and a bit line pair is selected using one of two kinds of the addresses A and B. A different bit line pair is selected using the other address. As a result, it is made possible to access the SRAM cells connected to the same word line and different bit line pairs in the same cycle. Thus, it becomes possible to perform the read operation and the write operation to these SRAM cells. The respective sets of column decoder and column selector can be controlled independently from each other based on two kinds of addresses A and B.

The SRAM circuit in the first embodiment has the read and write mode, and the read mode and the write mode as normal operation modes. In the read and write mode, a read operation and a write operation are both performed in one clock cycle at the same time. In the normal mode, the operation mode is set to a read mode in which a read operation is performed or a write mode in which a write operation is performed.

The switching of the operation mode is performed based on the mode signal MODE. An external input signal MODE in the first embodiment is shown by "Lo" or "Hi". If the external input signal MODE is "Lo", the operation mode is set to the normal mode for an operation as a usual single port SRAM. If the external input signal MODE is "Hi", the operation mode is set to the read and write mode.

An input signal ic composed of (n+1) address signals [0:n] (n≧3) of the address A, address signal [0:2] of the address B, a clock signal CLK, a read and write switching signal WEB to switch between the read operation and the write operation, an operation mode switching signal MODE, m data input signals IN and m data output signals OUT.

$2^{n-2}$ word lines and 8×m pairs of bit lines are configured like a single port SRAM circuit. As a memory cell, a single port SRAM cell is used.

Figure 5:
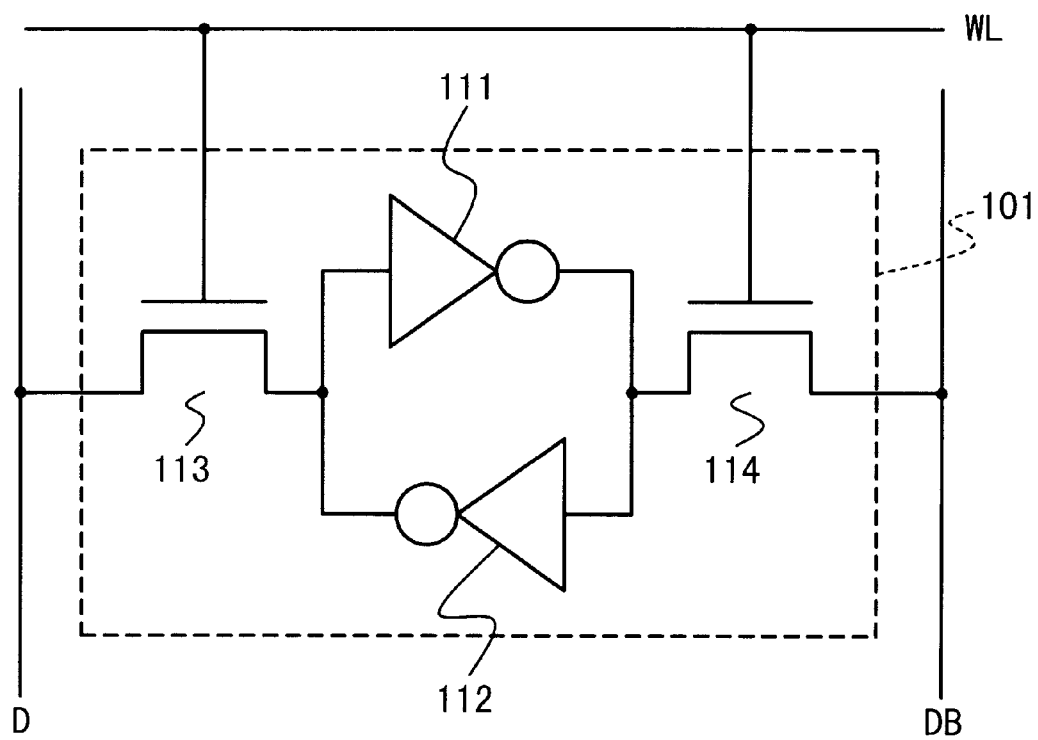
FIG. 5 is a circuit diagram illustrating the structure of a memory cell of the semiconductor memory device according to the first embodiment of the present invention.

FIG. 5 shows a single port SRAM cell. The single port SRAM cell is composed of six transistors. As shown in FIG. 5, the single port SRAM cell is composed of two inverter gates 111 and 112 as a latch circuit section and two transfer gates 113 and 114. As the SRAM cell, a high resistance load type cell may be used.

As for the two kinds of addresses, the address A is composed of (n+1) address signals and the address B is composed of three address signals. Three address signals of (n+1) address signals of the address A are supplied to the column decoder A 106 and the address selector 105 through an address latch A 102. The remaining (n-2) address signals of the (n+1) address signals are supplied to the word line decoder 103. The three address signals [0:2] of the address B are supplied to the address selector 105 through an address latch B 102. At this time, the three address signals [0:2] of the address A and the three address signals [0:2] of the address B are supplied such that the column decoder A 106 and the column decoder B 106 give different decoding values from each other.

The word line decoder 103 receives the (n-2) address signals of the address A and selects one of the word lines and controls the word line driver 104 to drive the selected word line, as in the single port SRAM circuit. The address selector 105 selects one of the set of three address signals [0:2] of the address A and the set of three address signals [0:2] of the address B to supply to the column decoder B 106. The decoded signals SA [0:7] are supplied from the column decoder A 106 to the column selector A 107, and the decoded signals SB[0:7] are supplied from the column decoder B 106 to the column selector B 107. Moreover, the column selector A 107 for a read operation is connected to the sense amplifier 109 and the column selector B for a write operation is connected to the write buffer 110. When the three address signals [0:2] of the address A and the three address signals [0:2] of the address B are equal to each other, the column decoder B 106 may be disabled.

The signal MODE is supplied to the address selector 105 and the mode switching circuit 108. The address selector 105 selects the three address signals [0:2] from the address A when the signal MODE indicates "Lo" and selects the three address signals [0:2] of the address B when the signal MODE indicates "Hi". On the other hand, the mode switching circuit 108 switches an operation mode based on the signal MODE and the signal WEB.

Figure 6:
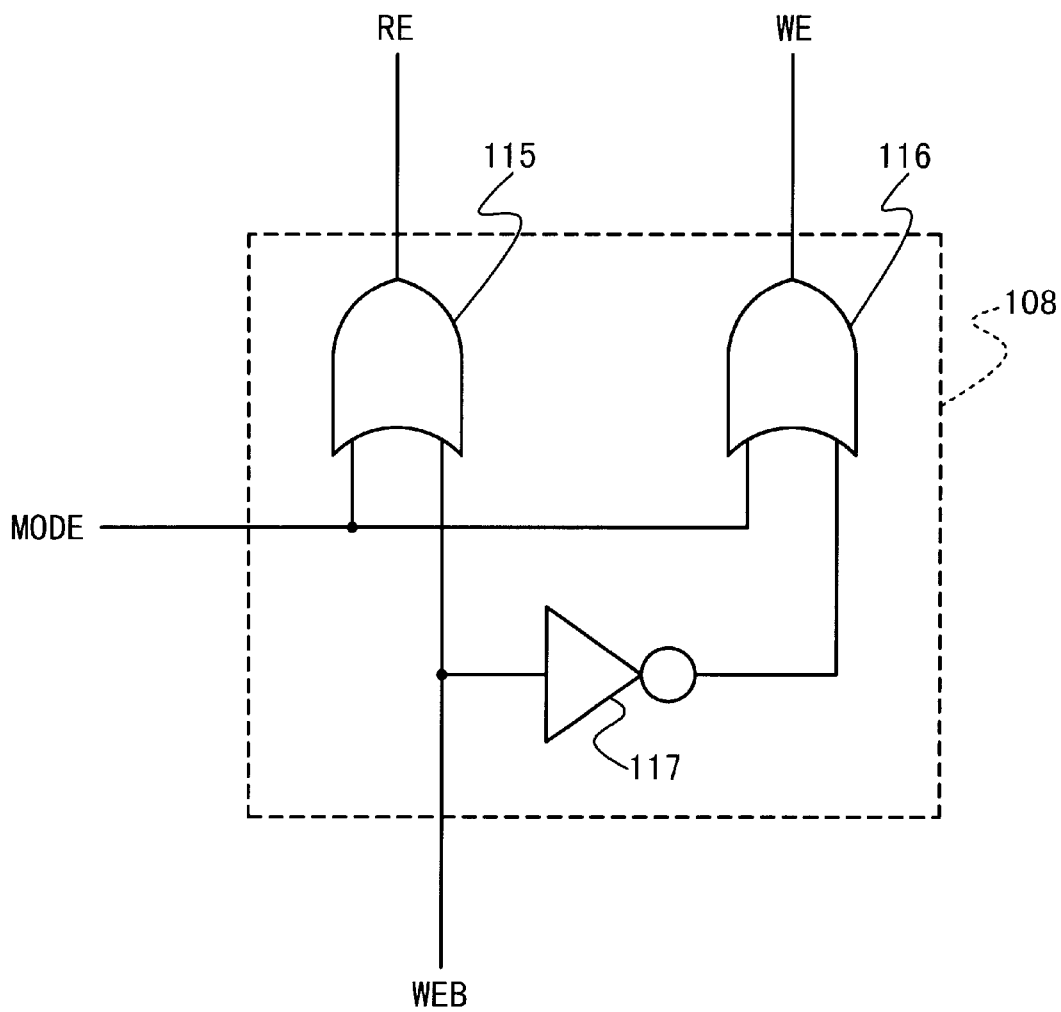
FIG. 6 is a circuit diagram illustrating a mode switching circuit in the semiconductor memory device according to the first embodiment of the present invention.

FIG. 6 shows the circuit structure of the mode switching circuit 108. The mode switching circuit 108 is composed of two OR gates 115 and 116 and one inverter gate 117. When the signal MODE indicates "Lo" and the signal WEB indicates "Lo", the mode switching circuit 108 sets the operation mode to the normal write mode such that the write operation as a usual single port SRAM is performed. When the signal MODE is "Lo" and the signal WEB indicates "Hi", the mode switching circuit 108 sets the operation mode to the normal read mode such that the read operation as the usual single port SRAM is performed. When the signal MODE indicates "Hi", the mode switching circuit 108 sets the operation mode to the read and write mode such that the read operation and the write operation are both performed at the same time in the same cycle, regardless of the state of the signal WEB.

FIGS. 7A to 7P are timing charts illustrating the operation of the SRAM circuit in the first embodiment. The operations in the 4 time periods T1 to T4 of the clock signal CLK are shown. The operations in the read and write mode are shown in the time periods T1 and T2. The time period T3 shows the operation in the normal write mode as the usual single port SRAM write operation and the time period T4 shows the operation in the normal read mode as the usual single port SRAM read operation.

One of the above three operation modes is selected based on the external input signals of the signal MODE and the signal WEB. The normal write mode for the single port SRAM write operation when the signal MODE indicates "Lo" and the signal WEB indicates "Lo". The normal read mode for the single port SRAM read operation when the signal MODE indicates "Lo" and the signal WEB indicates "Hi". The read and write mode is set when the signal MODE indicates "Hi".

Next, the operation will be described in order of from period T1 to period T4. An inverted signal of the clock signal CLK is supplied to a precharge circuit 100 such that a precharging operation of the bit lines is performed while the signal CLK is in "Lo".

In the time period T1, because the signal MODE is in "Hi" as shown in FIG. 7E, a read operation signal RE and a write operation signal WE are both set to "Hi" regardless of the signal WEB, as shown in FIGS. 7I and 7J. After the signal CLK rises, the sense amplifier 109 and the write buffer 110 start the operations.

The word line WL [i] is selected based on the address signals [3:n] of the address A after the CLK signal rises, as shown in FIG. 7K. The column decoder A drives the decode signal line SA [0] based on the address signals [0:2] of the address A, as shown in FIG. 7M. Also, the bit line pair D [0] and DB [0] is selected by the column selector A. The column decoder B drives the decode signal line SB[7] based on the address signals [0:2] of the address B, as shown in FIG. 7P. Also, the bit line pair D [7] and DB [7] are selected by the column selector B. As a result, a data of "Hi" is read out from the memory cell [i,0] to the output terminal OUT [k]. Also, a data of "Lo" supplied from the input terminal IN [k] is written in the memory cell [i,7].

In the time period T2, because the signal MODE is in "Hi", like the time period T1, the read operation signal RE and the write operation signal WE maintains "Hi", as shown in FIGS. 7I and 7J, so that the sense amplifier 109 and the write buffer 110 are in the enable state.

Because the address signals [3:n] of the address A is the same as in the time period T1, the same word line WL [i] is selected, as shown in FIG. 7K. The column decoder A drives the decode signal line SA [7] based on the address signals [0:2] of the address A, as shown in FIG. 7N. The bit line pair D [7] and DB [7] are selected by the column selector A. The column decoder B drives the decode signal line SB[0] based on the address signals [0:2] of the address B, as shown in FIG. 7O. The bit line pair D [0] and DB [0] is selected by the column selector B. As a result, a data of "Lo" which has been written in the time period T1 is read out from the memory cell ]i,7] to the output terminal OUT [k], and a data of "Lo"supplied from the input terminal IN [k] is written in the memory cell [i,0].

In the time period T3, the read operation signal RE is switched to "Lo" based on the signal MODE of "Lo" and the signal WEB of "Lo" in the state that the write operation signal WE outputted from the mode switching circuit 108 is in "Hi", so that the write buffer 110 is set to the enable state.

The word line WL [j] is selected in response to the change of the address signals [3:n] of the address A after the CLK signal rises, as shown in FIG. 7L. The column decoder A and the column decoder B drive the decode signal line SA [7] and the decode signal line SB[7] based on the address signals [0:2] of the address A, respectively. The same bit line pair D [7] and DB [7] is selected by the column selector A 107 and the column selector B 107. At this time, the address signals [0:2] of the address B is set to a disable state by the address selector 105. As a result, the data of "Lo" supplied from the input terminal IN [k] is written in the memory cell [j,7].

In the time period T4, the write operation signal WE is set to "Lo" based on the signal MODE of "Lo" and the signal WEB of "Hi". Therefore, the read operation signal RE is set to "Hi". The sense amplifier 109 operates after the signal CLK rises.

The word line WL [i] is selected based on the address signals [3:n] of the address A after the signal CLK rises. The column decoder A and the column decoder B drive the decoded line SA [0] and the decode signal line SB[0] based on the address signals [0:2] of the address A. The same bit line pair D [0] and DB [0] are selected by the column selector A and the column selector B, respectively. At this time, the address signals [0:2] of the address B are set to the disable state by the address selector 105. As a result, the memory cell [i,0] is accessed and the data of "Hi" is read out and supplied from the memory cell [i,0] to the output terminal OUT [k].

In this way, in the semiconductor memory device according to the first embodiment of the present invention, the read and write mode in which the read operation and the write operation are both performed at the same time in the same cycle, and the normal read or write mode in which the read operation or the write operation is performed for the usual single port SRAM. Thus, the SRAM circuit is realized.

Next, the semiconductor memory device according to the second embodiment of the present invention will be described below.

Figure 8:
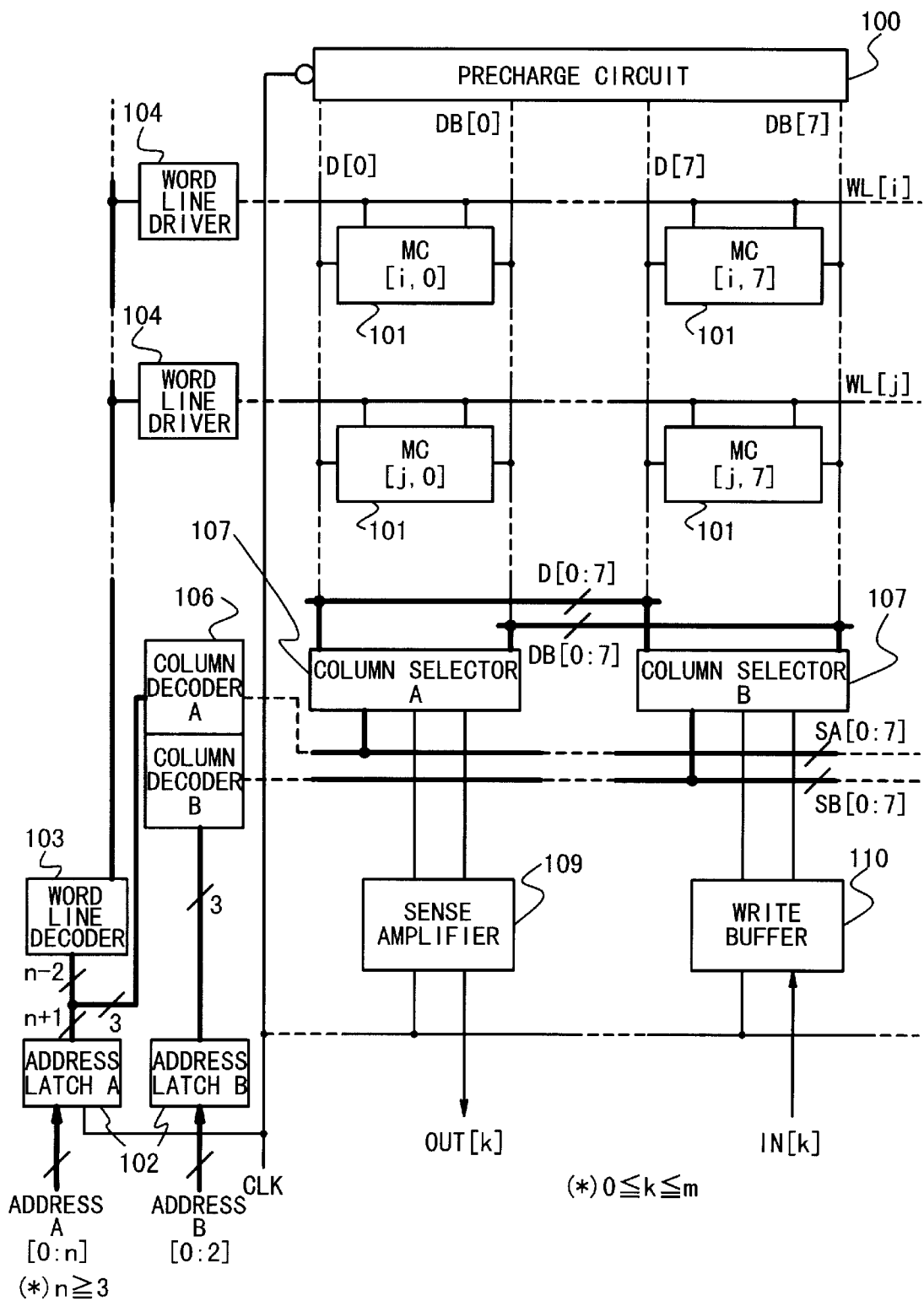
FIG. 8 is a block diagram illustrating the circuit structure of the semiconductor memory device according to a second embodiment of the present invention.

FIG. 8 shows the semiconductor memory device according to the second embodiment of the present invention. The semiconductor memory device in the second embodiment is the synchronous type SRAM circuit having the 8-column structure of n words×m bits, like the first embodiment. The different point between the first embodiment and the second embodiment is in that the signal WEB and the signal MODE as the external input signal are removed, and the address selector 105 and the mode switching circuit 108 are omitted. In the SRAM circuit in the second embodiment, the operation mode is limited to the read and write mode for the read and write operations in one clock cycle. The external input signal in the second embodiment includes the (n+1) address signals [0:n] (n≧3) of the address A, the address signals [0:2] of the addresses B, the clock signal CLK, the m data input signals IN [0:m] (0≦k≦m), and m data output signals OUT [0:m].

In the two kinds of addresses in the second embodiment, the second embodiment is the same as the first embodiment in that the address A is composed of (n+1) address signals and the address B is composed of three address signals. In the second embodiment, the address signals [0:2] of the address A are supplied to the column decoder A 106 as the read only address signals, and the address signals [0:2] of the address B are supplied to the column decoder B 106 as the write only address signals. In this way, the second embodiment is configured in such a manner that the selection of the operation mode of the read operation and write operation in the first embodiment for the single port is omitted.

The operation in the second embodiment will be described with reference to FIG. 9A to 9L. FIG. 9A to 9L are timing charts showing the operation in the 2 periods of T1 and T2 of the clock signal CLK. As the operation of each time period, the memory cell [i,0] and the memory cell [i,7] are accessed for the read operation and the write operation in the time period T1, respectively. The memory cell [j,0] and the memory cell [J,7] are accessed for the write operation and the read operation in the time period T2, respectively. The operation from the time period T1 to the time period T2 will be described in the order.

Figure 9:
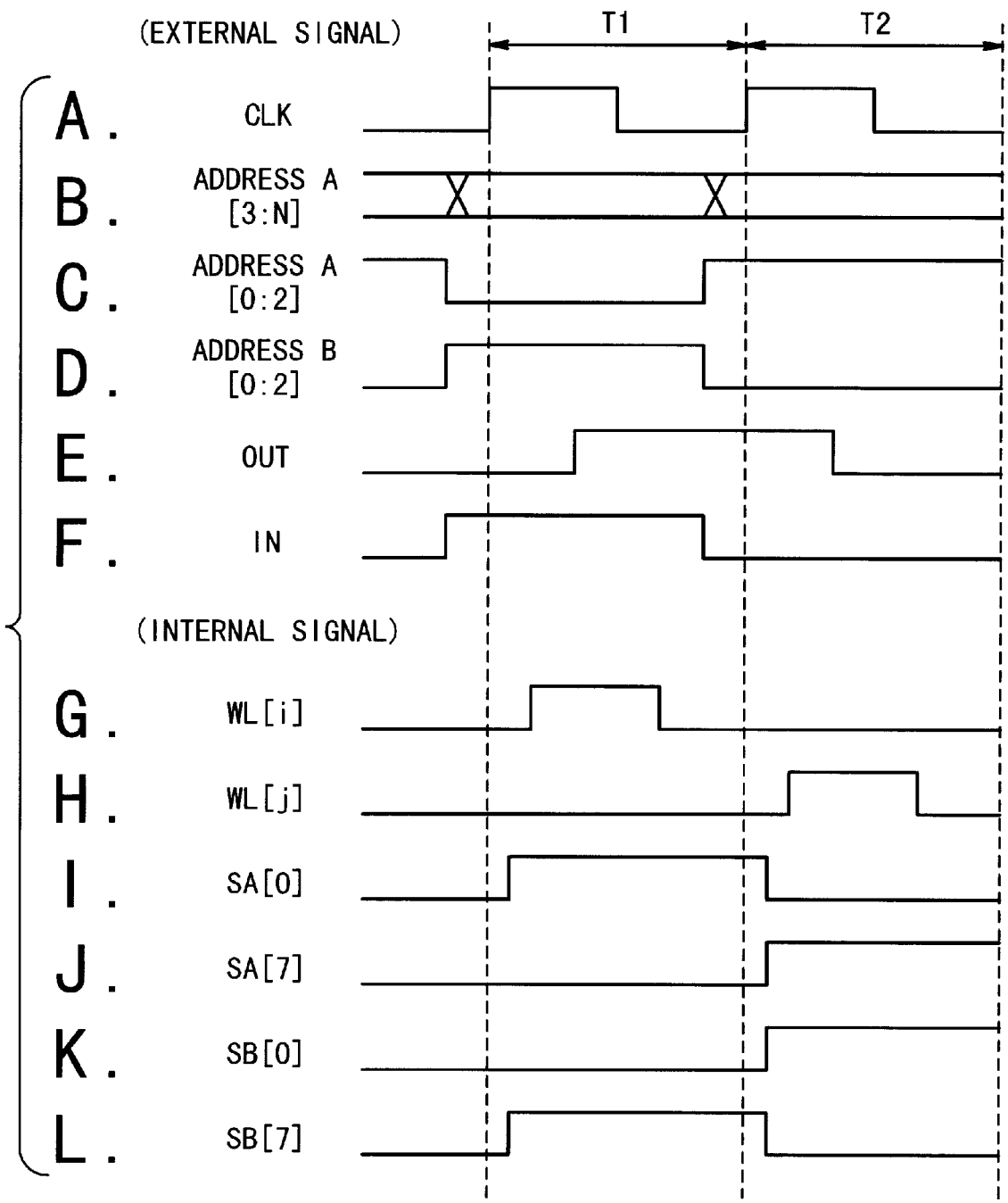
FIGS. 9A to 9L are timing charts to describe an operation of the semiconductor memory device according to the second embodiment of the present invention.

In the time period T1, the word line WL [i] is selected in response to the address signals [3:n] of the address A after the CLK signal rises, as shown in FIG. 9G. The column decoder A drives the decode signal line SA [0] in response to the address signals [0:2] of the address A, as shown in FIG. 9I and the column selector A selects a bit line pair D [0] and DB [0]. Also, the column decoder B drives the decode signal line SB [7] in response to the address signals [0:2] of the address B, as shown in FIG. 9L and the column selector B select a bit line pair D [7] and DB [7]. As a result, a stored data of "Hi" is read out from the memory cell [i,0] to the output terminal OUT [k], and a data of "Hi" is supplied from the input terminal IN [k] and is written in the memory cell [i,7].

In the time period T2, the word line WL [j] is selected in response to the change of the address signals [3:n] of the address A after the CLK signal rises, as shown in FIG. 9H. The column decoder A drives the decode signal line SA [7] in response to the address signals [0:2] of the address A, as shown in FIG. 9J, and the column selector A selects the bit line pair D [7] and DB [7]. The column decoder B drives the decode signal line SB[0] in response to the address signals [0:2] of the address B. as shown in FIG. 9K, and the column selector B selects the bit line pair D [0] and DB [0]. As a result, the stored data of "Lo" is read out from the memory cell [j,7] to the output terminal OUT [k] and a data of "Lo" is supplied from the input terminal IN [k] and is written in the memory cell [i,0].

In the second embodiment, the external input signals WEB and MODE in the first embodiment are omitted, and an address selector and a mode switching circuit can be omitted. Therefore, the SRAM circuit can be manufactured in a further smaller chip area, compared with the first embodiment.

Next, the semiconductor memory device according to the third embodiment of the present invention will be described.

Figure 7:
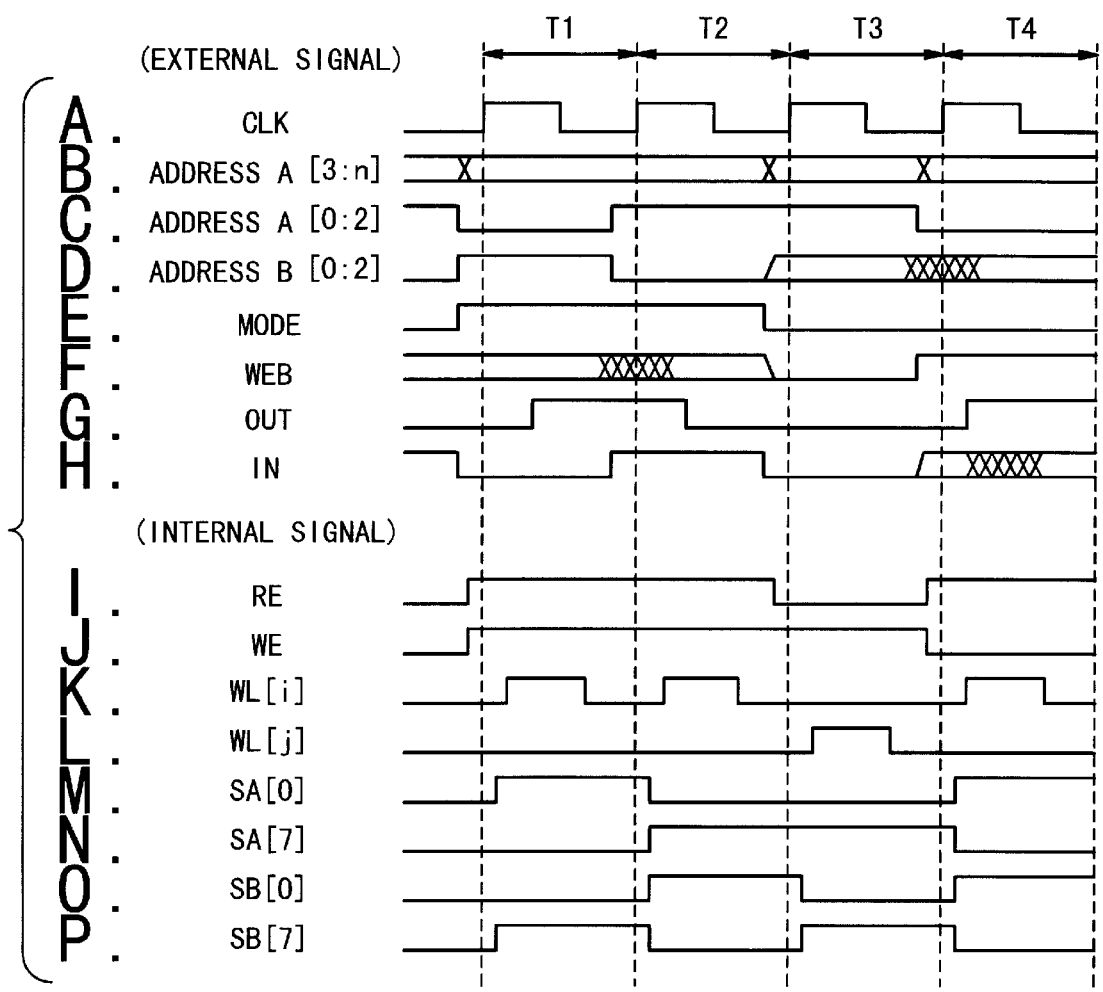
FIGS. 7A to 7P are timing charts to describe an operation of the semiconductor memory device according to the first embodiment of the present invention.
Figure 10:
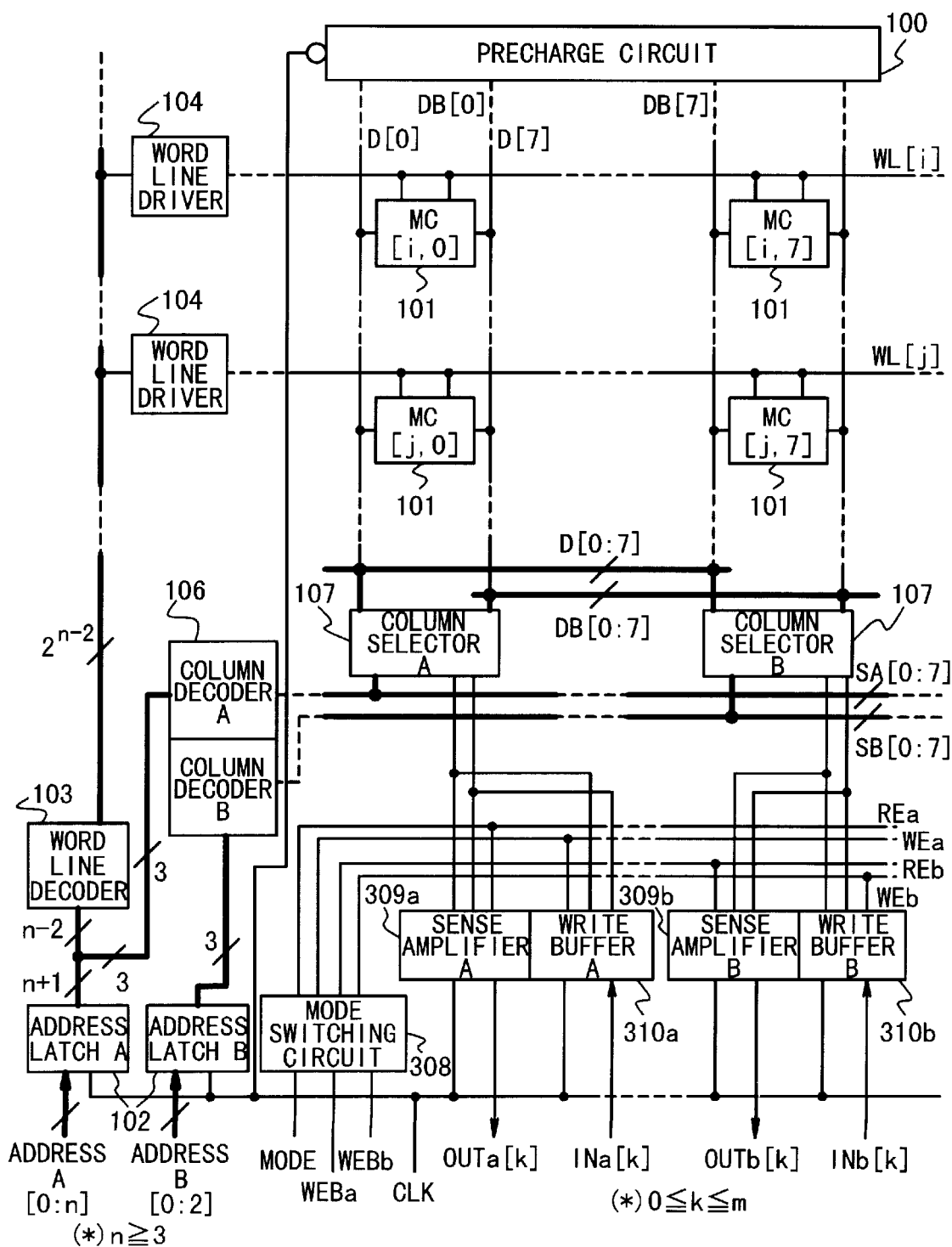
FIG. 10 is a block diagram illustrating the circuit structure of the semiconductor memory device according to a third embodiment of the present invention.

FIG. 7 shows the structure of the semiconductor memory device according to the third embodiment of the present invention. The semiconductor memory device shown in FIG. 10 is a synchronous type SRAM circuit of the 8 column structure of n words×m bits.

The third embodiment is different from the first and second embodiments in the following point. Three signals WEBa, WEBb and MODE are set as the external input signals. Also, a mode switching circuit 308 supplied with these three signals, two sense amplifiers 309a and 309b and write buffers 310a and 310b are provided.

Also, in the third embodiment, there are three operation modes: a read mode in which two data can be read out in an identical operation cycle, a write mode in which two data can be written in an identical operation cycle, and a read and write mode in which one data is read and another data is written in an identical operation cycle. This is like the the 2-port SRAM circuit. As shown in FIG. 10, in the third embodiment, the semiconductor memory device is provided with data output terminals OUTa and OUTb, and data input terminals INa and INb. Two input/output ports are provided for each of the terminals.

The signals WEBa and WEBb are external input signals used to select ports for a read operation and a write operation in the read and write mode in which the read operation and the write operation are performed in the identical cycle.

Also, the signal MODE indicates the external input signal used to select one of the read mode, the write mode, and the read and write mode.

Figure 11:
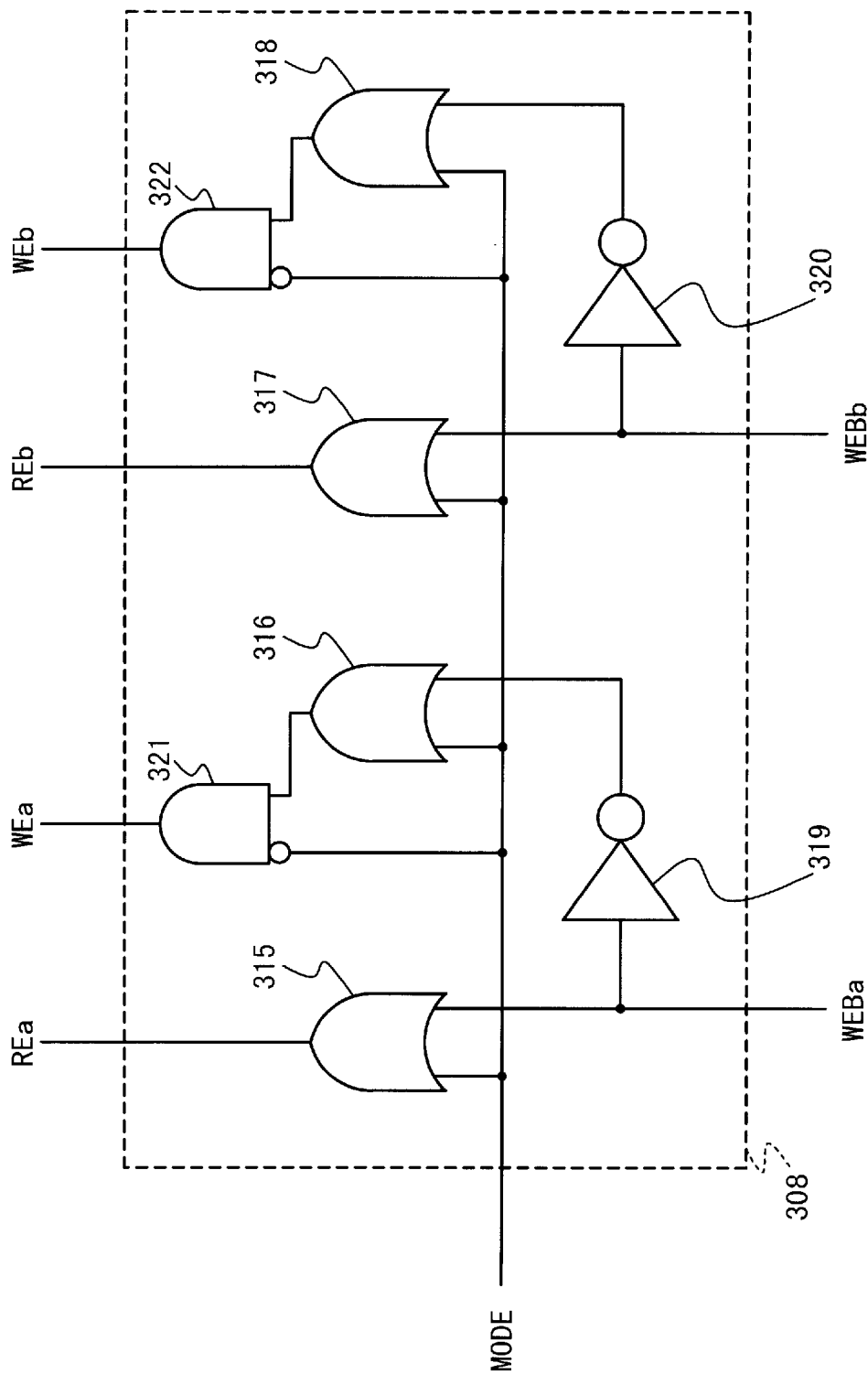
FIG. 11 is a circuit diagram illustrating a mode switching circuit in the semiconductor memory device according to the first embodiment of the present invention.

As shown in FIG. 11, the mode switching circuit 308 is composed by four OR gates 315, 316, 317 and 318 and two inverter gates 319 and 320. The mode switching circuit selects the write mode when all of the signal MODE, the signal WEBa, the signal WEBb are "Lo", and the read and write w mode when the signal MODE is "Lo", and one of the signals WEBa and WEBb is "Hi". Also, the mode switching circuit selects the read mode when the signal MODE signal is "Hi".

Figure 12:
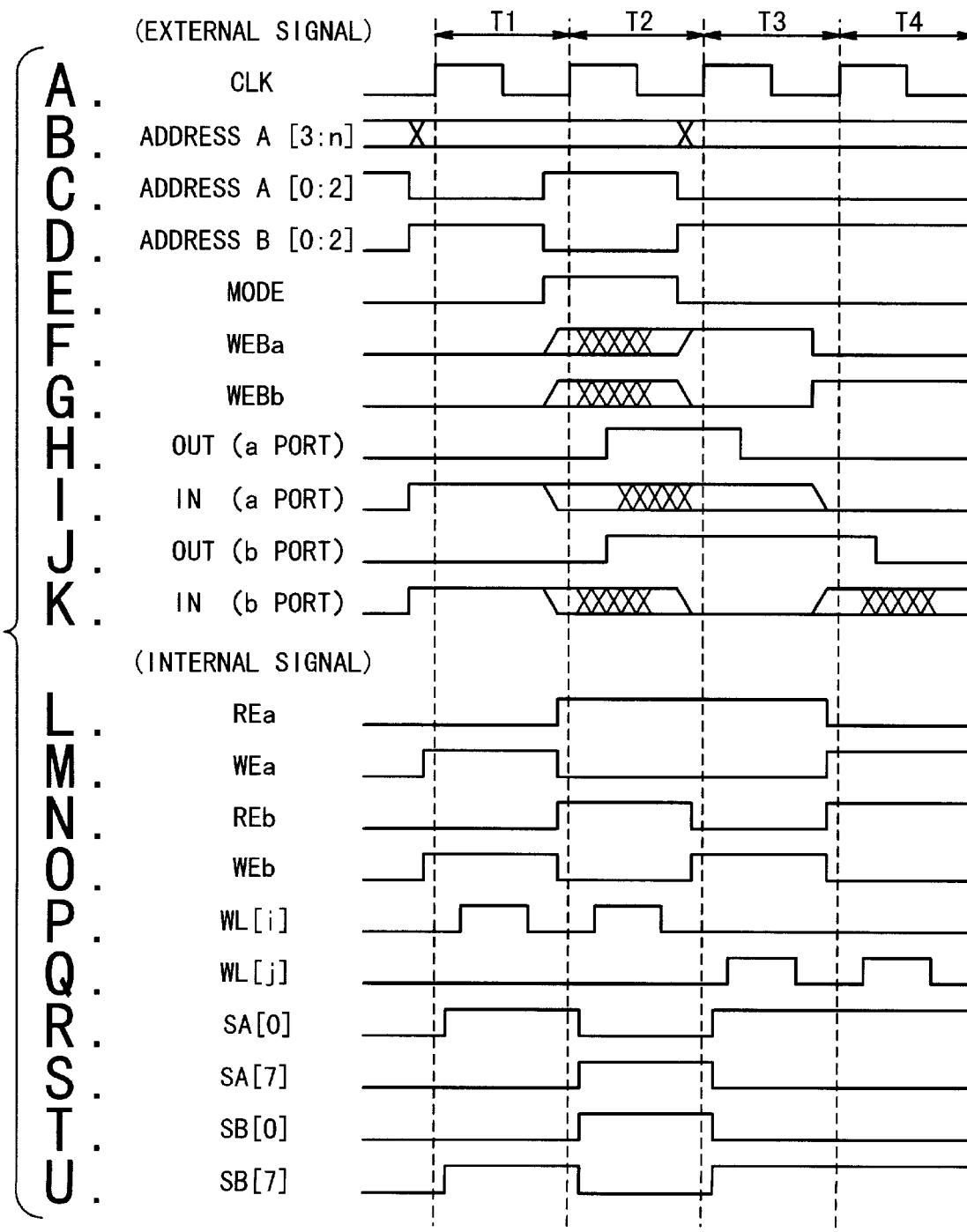
FIGS. 12A to 12U are timing charts to describe an operation of the semiconductor memory device according to the third embodiment of the present invention.

The operation of the semiconductor memory device in the third embodiment will be described with reference to FIGS. 12A to 12U. FIGS. 12A to 12U are timing charts showing the operation in the 4 time periods T1 to T4 of the clock signal CLK. The write mode is selected in the time period T1, the read mode is selected in the time period T2, and the read and write mode is selected in the time periods T3 and T4. Like the first and second embodiments, the bit lines are precharged while the clock signal is set to the "Lo" level, although being not shown in the figures.

In the time period T1, the mode switching circuit is supplied with the signal MODE of "Lo", the signal WEBa of "Lo", and the signal WEBb of "Lo", as shown in FIGS. 12E to 12G, so that the output signals WEa and WEb of the mode switching circuit are both set to a "Hi" level together, as shown in FIGS. 12M and 12O. Thus, after the CLK signal rises, the write buffers 310a and 310b start the operation. The word line WL [i] is selected in response to the address signals [3:n] of the address A after the CLK signal rises, as shown in FIG. 12P. The column decoder A drives the decode signal line SA [0] in response to the address signals [0:2] of the address A, as shown in FIG. 12R, and the column selector A selects the bit line pair D [0] and DB [0]. Also, the column decoder B drives the decode signal line SB[7] in response to the address signals [0:2] of the address B, as shown in FIG. 12U, and the column selector B selects the bit line pair D [7] and DB [7]. As a result, a data of "Hi" is supplied from the input terminal INa [k] and is written in the memory cell [i,0]. Also, a data of "Hi" is supplied from the input terminal INb [k] and is written in the memory cell [i,7].

In the time period T2, the signal MODE is set to the "Hi" level, as shown in FIG. 12E. Therefore, the operation mode is set to the read mode irrespective of the signals WEBa and WEBb signal so that the output signals REa and REb of the mode switching circuit 308 are set to the "Hi" level, as shown in FIGS. 12L and 12N. Thus, the sense amplifiers 309a and 309b starts the operations after the CLK signal rises. The word line WL [i] is selected in response to the address signals [3:n] of the address A, as shown in FIG. 12P. The column decoder A drives the decode signal line SA [7] in response to the address signals [0:2] of the address A, as shown in FIG. 12S, and the column selector A selects the bit line pair D [7] and DB [7]. Also, the column decoder B drives the decode signal line SB[0] in response to the address signals [0:2] of the address B, as shown in FIG. 12T, and the column selector B selects the bit line pair D [0] and DB [0]. As a result, the data of "Hi" which has been written in the memory cell [i,7] in the time period T1 is read out to the output terminal OUTa [k]. Also, the data of "Hi" which has been written in the memory cell [i,0] in the time period T1 is read out to the output terminal OUTb [k].

In the time period T3, the mode switching circuit 308 is supplied with the signal MODE of "Lo", and the signal WEBa of "Hi", as shown in FIGS. 12E to 12G, so that the output signals REa and WEb of the mode switching circuit 308 are set to the "Hi" level, as shown in FIGS. 12M and 12N. Thus, the sense amplifier 309a and the write buffer 310b start the operations after the CLK signal rises. The word line WL [j] is selected in response to the address signals [3:n] of the address A after the CLK signal rises. The column decoder A drives the decode signal line SA [0] in response to the address signals [0:2] of the address A and the column selector A selects the bit line pair D [0] and DB [0]. Also, the column decoder B drives the decode signal line SB[7] in response to the address signals [0:2] of the address B, and the column selector B selects the bit line pair D [7] and DB [7]. As a result, a data of "Lo" is read out from the memory cell [j,0] to the output terminal OUTa [k]. A data of "Lo" is supplied from the input terminal INb [k] and is written in the memory cell [j,7].

In the time period T4, the mode switching circuit 308 is supplied with the signal MODE of "Lo" and the signal WEBb of "Hi", so that the output signals WEa and REb of the mode switching circuit are set to the "Hi" level. Thus, the write buffers 310a and the sense amplifiers 309b start the operations after the CLK signal rises. The word line WL [j] is selected in response to the address signals [3:n] of the address A after the CLK signal rises. The column decoder A drives the decode signal line SA [0] in response to the address signals [0:2] of the address A and the column selector A selects the bit line pair D [0] and DB [0]. Also, the column decoder B drives the decode signal line SB[7] in response to the address signals [0:2] of the address B, and the column selector B selects the bit line pair D [7] and DB [7]. As a result, the same memory cells [J,0] and [J:7] as in the time period T3 are accessed. Thus, a data of "Lo" is supplied from input terminal INa [k] and is written in the memory cell [j,0]. Also, the data of "Lo" which has been written in the memory cell [j,7] in the time period T3 is read out to the output terminal OUTb [k].

In the third embodiment, the sense amplifier and the write buffer are further added as one set, compared with the first embodiment. However, the addition hardly is a problem in the increase of the chip area in the large capacity of SRAM circuit. Therefore, the effect of the reduction of the chip area from the 2-port SRAM circuit is approximately same as the first embodiment.

When the first to third embodiments are applied to a CMOS process of 0.35 μm, 50% of reductions are possible at the maximum compared with the conventional 2-port SRAM circuit, because the chip area of the single port SRAM cell is about ½ of the 2-port SRAM cell.

As described above, according to the semiconductor memory device of the present invention, the 2-access operation in a single operation cycle is realized with avoidance of the increase of the chip area. Such 2-access operation has been realized in the conventional 2-port SRAM circuit. However, in the present invention, it is realized by use of a single port SRAM cell. Generally, the ratio of the memory cells to the memory circuit in the chip area tends to increase as the memory capacity increases. Therefore, in the present invention, the same operation as that of the 2-port SRAM circuit can be realized while using the single port SRAM structure. As a result, the chip area can be reduced.

What is claimed is:

1. A semiconductor memory device comprising:
   a plurality of word lines;
   a plurality of bit lines;
   a plurality of memory cells arranged in a matrix, wherein each of said plurality of memory cells is connected to one of said plurality of word lines and is connected to one of said plurality of bit lines such that a plurality of columns are formed from said plurality of memory cells;
   a word line selecting section for selecting one of said plurality of word lines based on a first address;
   a first column selector connected to said plurality of columns, for selecting one of said plurality of columns as a first column based on said first address;
   a second column selector connected to said plurality of columns, for selecting another one of said plurality of columns as a second column based on a second address, an address data of a predetermined portion of said first address being not equal to an address data of said second address; and
   an input/output section which includes a first sense amplifier connected to said first column selector and a first buffer connected to said second column selector,
   wherein a first read operation is performed to a first memory cell connected to said selected word line and said first column through said first sense amplifier and said first column selector and a first write operation is performed to a second memory cell connected to said selected word line and said second column through said first buffer and said second column selector.

2. A semiconductor memory device according to claim 1, wherein said second column selector is disabled when the address data of the w predetermined portion of said first address is equal to the address data of said second address.

3. A semiconductor memory device according to claim 1, wherein said first read operation and said first write operation are performed in an operation cycle.

4. A semiconductor memory device according to claim 1, further comprising a mode switching circuit for selecting, as an operation mode in an operation cycle, one of a read mode in which said first read operation is performed, a write mode in which said first write operation is performed, and a read and write mode in which said first read operation and said first write operation are performed at a time.

5. A semiconductor memory device according to claim 4, wherein said first sense amplifier is set to an enable state in said read and write mode and in said read mode, and said first buffer is set to an enable state in said read and write mode and said write mode.

6. A semiconductor memory device according to claim 4, wherein said mode switching circuit includes:
   an inverting circuit for inverting a write control signal;
   a first OR gate for receiving a mode signal at one of input terminals and said write control signal at the other input terminal; and
   a second OR gate receiving for receiving said mode signal at one of input terminals and said inverted write control signal at the other input terminal.

7. A semiconductor memory device according to claim 1, wherein said input/output section further includes:
   a second sense amplifier connected to the said second column selector in parallel to said first buffer section; and
   a second buffer connected to said first column selector in parallel to said first sense amplifier, and
   wherein a second read operation is performed to said second memory cell connected to said selected word line and said second column through said second sense amplifier and said second column selector and a second write operation is performed to said first memory cell connected to said selected word line and said first column through said second buffer and said first column selector.

8. A semiconductor memory device according to claim 7, further comprising a mode switching circuit for selecting, as an operation mode in an operation cycle, one of a read mode in which one or both of said first read operation and said second read operation are performed, a write mode in which one or both of said first write operation and said second write operation are performed, and a read and write mode in which one of a set of said first read operation and said first write operation and a set of said second read operation and said second write operation are performed at a time.

9. A method of making several accesses possible in a semiconductor memory device, comprising:
   selecting one of rows of single port memory cells in a matrix based on a first address;
   selecting one of said memory cells of said selected row as a first memory based on said first address;

selecting another one of said memory cells of said selected row as a second memory based on a second address, an address data of a predetermined portion of said first address being not equal to an address data of said second address; and accessing said first and second memory cells in an operation cycle.

10. A method according to claim 9, wherein a access mode is fixed, and said access to said first memory is a read access and said access to said second memory is a write access.

11. A method according to claim 9, further comprising disabling said selection of said second memory when the address data of the predetermined portion of said first address is equal to the address data of said second address.

12. A method according to claim 9, further comprising setting an access mode.

13. A method according to claim 12, wherein when said access mode is a read mode, said accesses to one or both of said first and second memory cells are read accesses.

14. A method according to claim 12, wherein when said access mode is a write mode, said accesses to one or both of said first and second memory cells are write accesses.

15. A method according to claim 12, wherein when said access mode is a read and write mode, said access to one of said first and second memory cells are a read access and said access to the other is a write access.

* * * * *